(12) United States Patent
Naso (10) Patent No.: US 7,434,152 B2
(45) Date of Patent: Oct. 7, 2008

(54) MULTIPLE-LEVEL DATA COMPRESSION READ MODE FOR MEMORY TESTING

(75) Inventor: Giovanni Naso, Frosinone (IT)

(73) Assignee: Micron Technology, Inc., Boise, ID (US)

( * ) Notice: Subject to any disclaimer, the term of this patent is extended or adjusted under 35 U.S.C. 154(b) by 625 days.

(21) Appl. No.: 11/127,810

(22) Filed: May 12, 2005

(65) Prior Publication Data
US 2006/0044880 A1 Mar. 2, 2006

(30) Foreign Application Priority Data
Aug. 25, 2004 (IT) .................. RM2004A0418

(51) Int. Cl.
G06F 7/02 (2006.01)
H03M 13/00 (2006.01)
(52) U.S. Cl. .................. 714/819; 714/718; 714/732
(58) Field of Classification Search ......... 714/718–723, 714/819, 732; 365/200–201
See application file for complete search history.

(56) References Cited

U.S. PATENT DOCUMENTS

| | | | | |
|---|---|---|---|---|
| 3,585,378 | A * | 6/1971 | Bouricius et al. ........... 714/805 |
| 4,872,168 | A | 10/1989 | Aadsen et al. | |
| 5,265,055 | A * | 11/1993 | Horiguchi et al. ........... 365/200 |
| 5,442,641 | A * | 8/1995 | Beranger et al. ............ 714/719 |
| 5,535,164 | A | 7/1996 | Adams et al. | |
| 5,740,098 | A | 4/1998 | Adams et al. | |
| 5,808,946 | A | 9/1998 | Roohparvar | |
| 5,913,928 | A * | 6/1999 | Morzano .................... 714/710 |
| 6,016,561 | A * | 1/2000 | Roohparvar et al. ........ 714/720 |
| 6,032,274 | A | 2/2000 | Manning | |
| 6,072,737 | A | 6/2000 | Morgan et al. | |
| 6,550,026 | B1 | 4/2003 | Wright et al. | |
| 6,930,936 | B2 * | 8/2005 | Santin ........................ 365/201 |

FOREIGN PATENT DOCUMENTS

| JP | 405325598 A | 12/1993 |
|---|---|---|
| JP | 408077797 A | 3/1996 |

* cited by examiner

Primary Examiner—Jacques Louis-Jacques
Assistant Examiner—Steve Nguyen
(74) Attorney, Agent, or Firm—Leffert Jay & Polglaze, P.A.

(57) ABSTRACT

Memory devices having a normal mode of operation and a test mode of operation are useful in quality programs. The test mode of operation includes a data compression test mode having more than one level of compression. The time necessary to read and verify a repeating test pattern can be reduced as only a fraction of the words of the memory device need be read to determine the ability of the memory device to accurately write and store data values. Output is selectively disabled if a bit location for one word of a group of words has a data value differing from any remaining word of its group of words for a number of groups of words.

42 Claims, 6 Drawing Sheets

MULTIPLE-LEVEL DATA COMPRESSION READ MODE FOR MEMORY TESTING

RELATED APPLICATION

This application claims priority to Italian Patent Application Serial No. RM 2004 A 000418, filed Aug. 25, 2004, entitled "MULTIPLE-LEVEL DATA COMPRESSION READ MODE FOR MEMORY TESTING," which is commonly assigned.

TECHNICAL FIELD OF THE INVENTION

The present invention relates generally to semiconductor memory devices, and in particular, the present invention relates to test methods for semiconductor memory devices as well as circuits and apparatus for implementing such methods.

BACKGROUND OF THE INVENTION

Electronic information handling or computer systems, whether large machines, microcomputers or small and simple digital processing devices, require memory for storing data and program instructions. Various memory systems have been developed over the years to address the evolving needs of information handling systems. One such memory system includes semiconductor memory devices.

Semiconductor memory devices are rapidly-accessible memory devices. In a semiconductor memory device, the time required for storing and retrieving information generally is independent of the physical location of the information within the memory device. Semiconductor memory devices typically store information in a large array of cells.

Computer, communication and industrial applications are driving the demand for memory devices in a variety of electronic systems. One important form of semiconductor memory device includes a non-volatile memory made up of floating-gate memory cells called flash memory. Flash memory is often used where regular access to the data stored in the memory device is desired, but where such data is seldom changed. Computer applications use flash memory to store BIOS firmware. Peripheral devices such as printers store fonts and forms on flash memory. Digital cellular and wireless applications consume large quantities of flash memory and are continually pushing for lower voltages and higher densities. Portable applications such as digital cameras, audio recorders, personal digital assistants (PDAs) and test equipment also use flash memory as a medium to store data.

Conventional flash memory cells make use of a floating-gate transistor including a source region, a drain region, a floating-gate layer and a control-gate layer. In such devices, access operations are carried out by applying biases to each of these terminals. Write operations are generally carried out by channel hot-carrier injection. This process induces a flow of electrons between the source and the drain, and accelerates them toward a floating gate in response to a positive bias applied to the control gate. Read operations generally include sensing a current between the source and the drain, i.e., the MOSFET current, in response to a bias applied to the control gate. Erase operations are generally carried out through Fowler-Nordheim tunneling. This process may include electrically floating the drain region, grounding the source region, and applying a high negative voltage to the control-gate layer.

Another important form of semiconductor memory device includes a volatile memory called dynamic random access memory (DRAM). DRAM is often used where rapid access to the memory array is desired for both data input and data output. DRAM has faster access times than flash memory, but requires periodic refresh to avoid losing its data values. Typical DRAM configuration includes an array of memory cells placed at the intersection of word lines and bit lines. Each memory cell includes an access transistor, with the gate of each access transistor coupled to a word line. A first source/drain region of an access transistor is coupled to a bit line and a second source/drain region of the access transistor is coupled to a first plate of a capacitor. The data value is stored as a charge on the capacitor and the data value is sensed by charge sharing with the associated bit line and detecting the change to the bit-line potential as a result of the charge sharing. Computer applications typically use DRAM to store program instructions and other temporary data.

Prior to shipping, a manufacturer may test its semiconductor memory devices as part of a quality program to improve end-use reliability. One of the tests performed includes a write verify test. Generally, the write verify test is used to test the ability of the memory array to receive, retain and output data reliably. Such tests typically first involve writing a pattern of data, e.g., an input pattern of 1s (ones) and 0s (zeros), to the memory array. The memory array is subsequently accessed to sense and output the data stored in the memory array. The data is often output as a page of data containing two or more words with each word containing some number of bits. The output data is then compared to the pattern of data originally input to the memory array on a bit-by-bit basis, and generally one word at a time, by an arbitration circuit of a testing apparatus. If each bit of each word of the output data matches the corresponding bit of the input pattern, the device passes the test. A mismatch between any bit of any word of the output data and the input pattern is indicative of a device failure. These tests, while valuable to verify device reliability, are time consuming and expensive.

U.S. patent application Ser. No. 09/943,642 filed Aug. 30, 2001, titled "DATA COMPRESSION READ MODE FOR MEMORY TESTING" and published Aug. 29, 2002 as U.S. Patent Application Publication 2002/0118580 A1, describes a data compression test mode wherein reading one word of an output page provides an indication of the data values of the remaining words of the output page. In this manner, read time of a memory array having a repeating pattern can be reduced to a fraction of the time required to read every word of the array. Consequently, the time required for testing the ability of a memory device to accurately store data can be reduced. Such methods can reduce testing time generally by an order of magnitude, but as memory sizes become larger, still higher reductions in testing time are advantageous.

For the reasons stated above, and for other reasons stated below that will become apparent to those skilled in the art upon reading and understanding the present specification, there is a need in the art for alternative methods of testing memory devices, circuits for implementing such test methods, and memory devices making use of such circuits and test methods.

SUMMARY OF THE INVENTION

The above-mentioned problems with memory devices and other problems are addressed by the present invention and will be understood by reading and studying the following specification.

Testing of memory devices is generally performed as part of a quality program to improve end-use reliability. The memory devices described herein are capable of a normal mode of operation and a test mode of operation. The test mode of operation includes a data compression test mode wherein reading one word provides as indication of the data values of multiple groups of words. In this manner, read time of a memory array having a repeating pattern can be reduced to a fraction of the time required to read every word of the array. Consequently, the time required for testing the ability of a memory device to accurately store data can be reduced. The data compression occurs on more than one level, further increasing testing efficiency over single-level data compression.

The invention provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Although the testing methods and data compression circuits described herein are applicable to a variety of memory device types, including various forms of volatile and non-volatile memory devices known in the art, such methods and compression circuits will be described in relation to a flash memory device. Those skilled in the art will readily recognize their applicability to other memory devices providing page output containing two or more words.

Figure 1A:
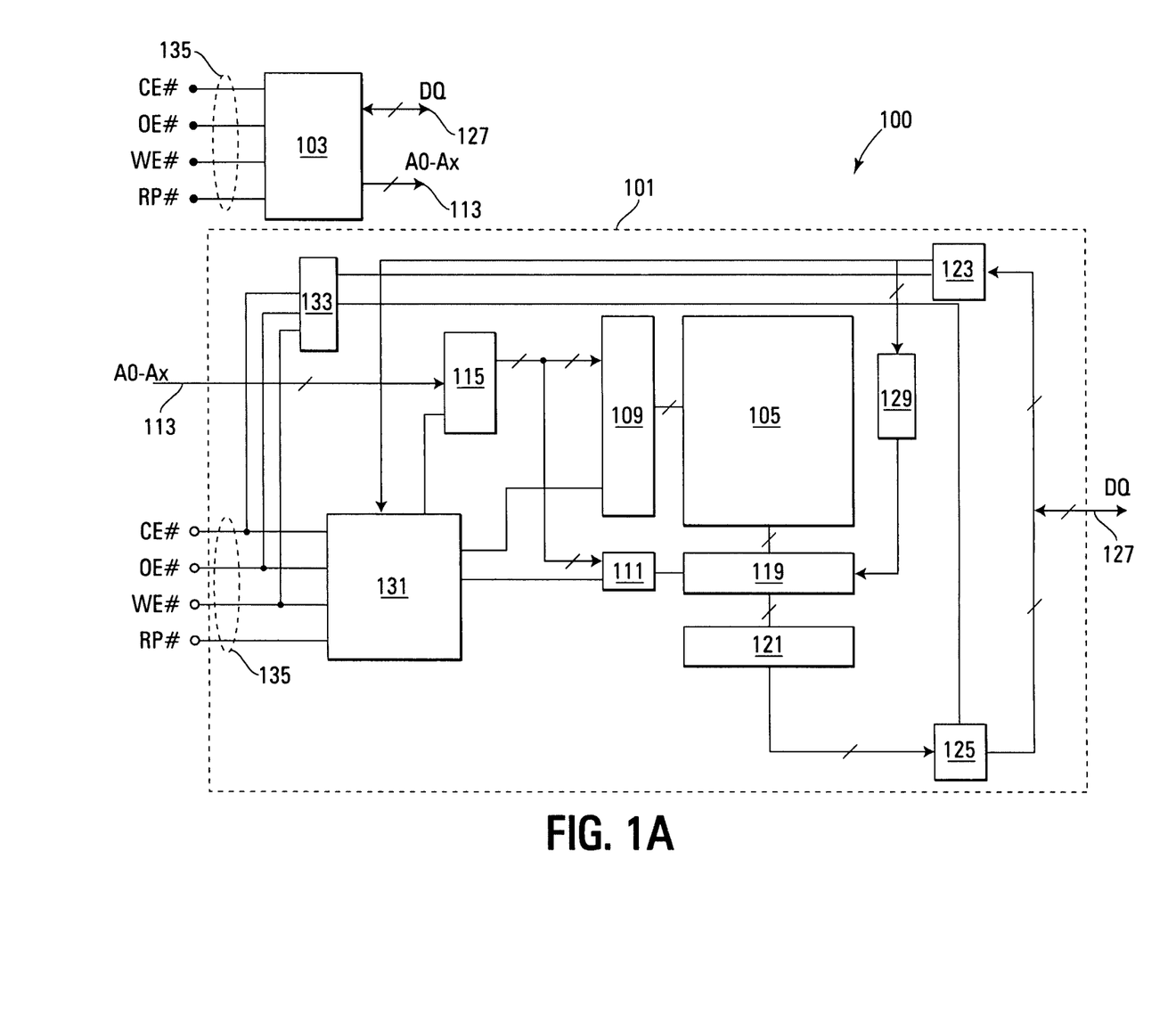
FIG. 1A is a functional block diagram of a basic flash memory device coupled to a processor in accordance with an embodiment of the invention.

FIG. 1A is a functional block diagram of a basic flash memory device 101 that is coupled to a processor 103. The memory device 101 and the processor 103 may form part of an electronic system 100. The memory device 101 has been simplified to focus on features of the memory that are helpful in understanding the present invention. The memory device 101 includes an array of memory cells 105. The memory cells of the memory device 101 may be non-volatile floating-gate memory cells. The memory array 105 is arranged in rows and columns, with the rows arranged in blocks. A memory block is some discrete portion of the memory array 105. Individual word lines generally extend to only one memory block while bit lines may extend to multiple memory blocks. The memory cells generally can be erased in blocks. Data, however, may be stored in the memory array 105 separate from the block structure.

A row decoder 109 and a column decoder 111 are provided to decode address signals provided on address lines A0-Ax 113. An address buffer circuit 115 is provided to latch the address signals. Address signals are received and decoded to access the memory array 105. A column select circuit 119 is provided to select a column of the memory array 105 in response to control signals from the column decoder 111. Sensing circuitry 121 is used to sense and amplify data stored in the memory cells. Data input 123 and output 125 buffer circuits are included for bi-directional data communication over a plurality of data (DQ) lines 127 with the processor 103. A data latch 129 is typically provided between data input buffer circuit 123 and the column select circuit 119 for storing data values (to be written to a memory cell) received from the DQ lines 127. Data amplified by the sensing circuitry 121 is provided to the data output buffer circuit 125 for output on the DQ lines 127. The data output buffer circuit 125 includes a data compression circuit in accordance with the embodiments of the invention.

Command control circuit 131 decodes signals provided on control lines 135 from the processor 103. These signals are used to control the operations on the memory array 105, including data read, data write, and erase operations. Input/output control circuit 133 is used to control the data input buffer circuit 123 and the data output buffer circuit 125 in response to some of the control signals.

Semiconductor memory devices are generally fabricated on semiconductor substrates. Each of these substrates typically contains a number of individual semiconductor memory devices formed in rectangular areas known as dies. After fabrication, each die is separated, or diced, then packaged in a format suitable for the end user. As stated above, the flash memory device 101 has been simplified to facilitate a basic understanding of the features of the memory. A more detailed understanding of flash memories is known to those skilled in the art.

Figure 1B:
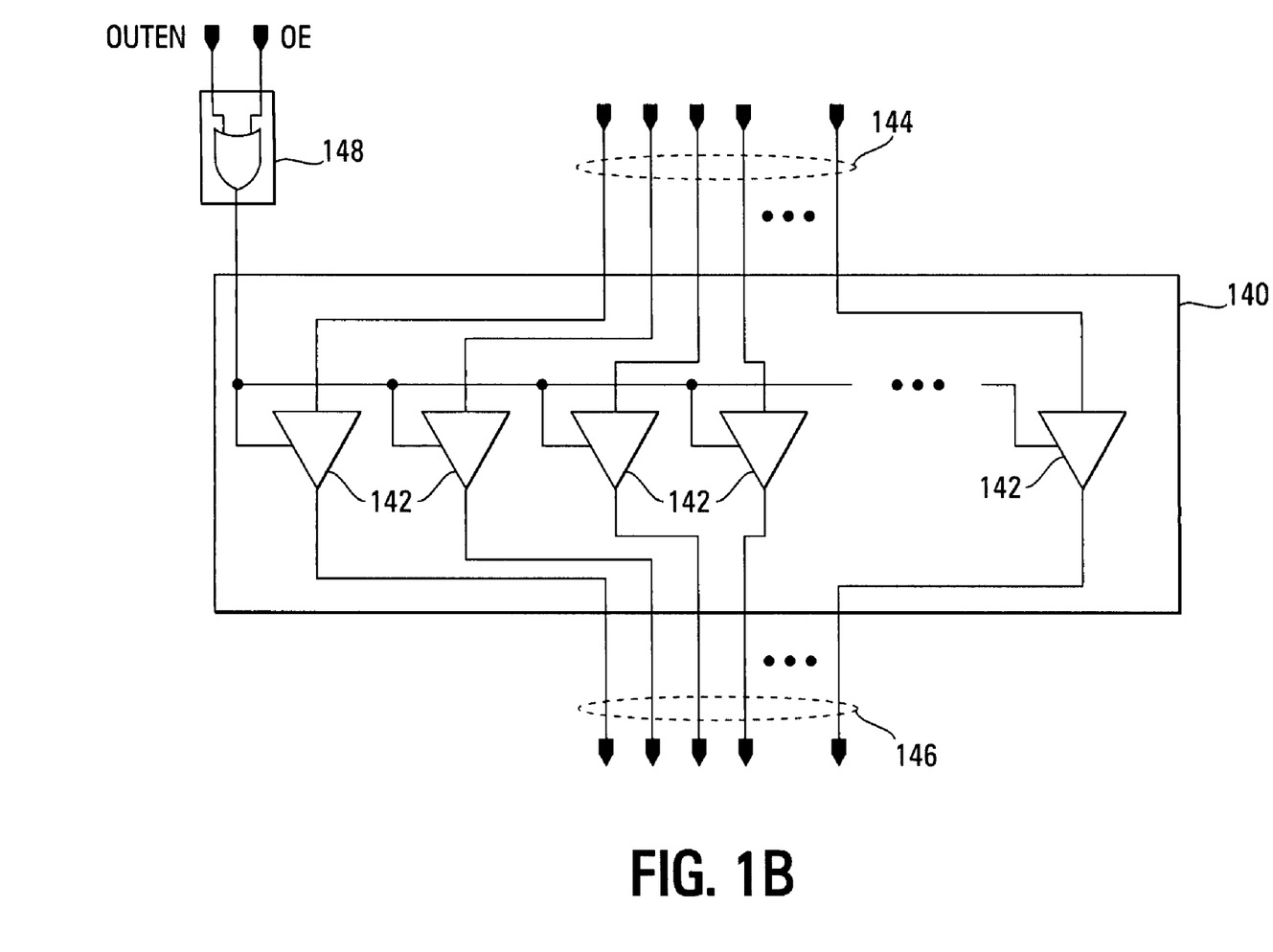
FIG. 1B is a functional block diagram of an output driver stage for use in the memory device of FIG. 1A in accordance with one embodiment of the invention.

The data output buffer circuit 125 typically includes an output driver stage having an output driver circuit for each DQ line 127. FIG. 1B is a functional block diagram of an output driver stage 140 for use with the memory device 101 of FIG. 1A in accordance with one embodiment of the invention. The output driver stage 140 includes one or more output driver circuits 142. Inputs 144 of the output driver circuits 142 receive the data signals, such as from buffers of the data output buffer circuit 125. There is one input 144 corresponding to each bit location of a word and thus to each DQ line 127. Outputs 146 of the output driver circuits 142 are associated with and coupled to each DQ line 127 in a one-to-one relationship. Each output driver circuit 142 is responsive to an output enable signal provided by the processor 103, such as the external control signal OE#, and to an inhibit signal, such as the internal control signal OUTEN. FIG. 1B depicts combining a global output enable signal OE# and a global inhibit signal OUTEN in a logic circuit 148, and providing the combined control signal to each output driver circuit 142.

The global inhibit signal OUTEN may be generated by combining the local inhibit signal from each data compression circuit in another logic circuit, such as an OR gate. In this manner, if one data compression circuit indicates that its given bit location has failed, all output driver circuits 142 may be simultaneously disabled. Alternatively, separate output enable signals and inhibit signals can be applied to each output driver circuit 142 to selectively disable only that output driver circuit 142 corresponding to the failed bit location. In addition, the output enable signal and the inhibit signal can be individually applied to each output driver circuit 142, provided each output driver circuit 142 is adapted to respond to two control signals as described herein, e.g., permitting disabling of an output driver circuit 142 in response to a logic level of the inhibit signal regardless of a logic level of the output enable signal.

As is well known in the art, an output driver circuit 142 may include a tri-state buffer circuit having three possible output states. In a first state, the output driver circuit 142 provides a first potential level, such as a supply potential, indicative of a first logic level. In a second state, the output driver circuit 142 provides a second potential level, such as a ground potential, indicative of a second logic level. In a third state, the output driver circuit 142 provides a high impedance level. The output driver circuit 142 is placed in the third state when data output is disabled. In the absence of an inhibit signal, the output driver circuit 142 is generally responsive to both a data signal and an output enable signal. When the output enable signal has a first logic value, such as a logic high level, the output driver circuit 142 is disabled, thereby presenting a high impedance level regardless of the logic level of the data signal. When the output enable signal has a second logic level, such as a logic low level, the output driver circuit 142 may be enabled to present either the first potential level or the second potential level indicative of the logic level of the data signal. The command control circuit 131 provides the additional control signal to the data output buffer circuit 125 to selectively disable the output driver circuit regardless of the logic level of the output enable signal; this inhibit signal is generated by a data compression circuit as described herein.

As mentioned earlier, a write verify test may be used to test the ability of the memory array to receive, retain and output data reliably. Such tests typically first involve writing a pattern of data, e.g., an input pattern of 1s and 0s, to the memory array. The input pattern is often a repeating pattern, with each word of the input page having the same pattern. For example, for a page containing two 8-bit words, the pattern may be all zeros "0000000000000000," all ones "1111111111111111", checkerboard "0101010101010101" or reverse checkerboard "1010101010101010." In general terms, in a repeating pattern for a page having two or more words, every bit of a first word has the same data value as its corresponding bit of each remaining word such that each word has the same data pattern. Stated alternatively, for a page having M words of N bits each, $bit_n = bit_{mN+n}$ for each value of m and n, where m is some integer value from 0 to M−1 and n is some integer value from 0 to N−1.

While each word of data output in page mode is accessed and sensed in parallel, the data is generally output on the DQ lines in serial fashion as the number of DQ lines is generally less than the number of bits in a page. During testing, a testing apparatus will typically compare each word of the page as it is provided on the DQ lines. The various embodiments of the invention provide for reduced testing time by eliminating the need for the testing apparatus to read each word in order to determine data accuracy. Reductions in testing time are facilitated by providing a data compression test mode within the memory device having at least two levels of compression.

In the data compression test mode, the data value of the $i^{th}$ bit location of a first word is compared with the data value of the $i^{th}$ bit location of each remaining word of a group of words. This comparison is performed internal to the memory device. Each group of words contains two or more words. For one embodiment, each group contains eight to ten words. The results of each group are then compared to determine if all groups indicated that their $i^{th}$ bits had the same logic levels. Output in this test mode is only provided if the $i^{th}$ bit of each word of each group has the same logic level.

For various embodiments, in the first level of data compression, two match signals are generated. A match of all of the $i^{th}$ bits is indicated, e.g., when the first match signal and the second match signal have differing logic levels. A mismatch of at least one of the $i^{th}$ bits is indicated, e.g., if the first and second match signals have the same logic level.

For one embodiment, in the first level of data compression, a first match signal having a first logic level and a second match signal having a second logic level are generated if every $i^{th}$ bit of a group of words is identical and every $i^{th}$ bit of the group of words has the first logic level. The first match signal will have the second logic level and the second match signal will have the first logic level if every $i^{th}$ bit of the group of words is identical and every $i^{th}$ bit of the group of words has the second logic level. The first and second match signals will each have the same logic level, e.g., the first logic level, if at least one $i^{th}$ bit of the group of words has a logic level different than an $i^{th}$ bit of another word of that group.

In the second level of data compression, the first and second match signals for each of two or more of groups of words are compared to generate a third match signal. A match of all of the $i^{th}$ bits is indicated by the third match signal if each group's match signals indicate a match within that group of words. If any group indicates a mismatch, the third match signal indicates a mismatch. For one embodiment, the third match signal is generated having a first logic level only if all of the groups indicate that their $i^{th}$ bits have the same logic level and having a second logic level if any of the groups indicates a mismatch of an $i^{th}$ bit or if any group indicates a different data pattern for its words. The third match signal of the data compression test mode may be used as an inhibit signal to selectively inhibit or permit the output driver circuit to provide the output word, e.g., the first word, on the DQ lines in response to the output enable signal OE#. As an example, when the inhibit signal has the second logic level, the output driver circuit is responsive to the output enable signal OE#. But, when the inhibit signal has the first logic level, the output driver circuit is disabled regardless of the value of the output enable signal OE#. In this manner, the output word is provided on the DQ lines only when every $i^{th}$ bit matches, provided the output driver circuit is not disabled by the output enable signal OE#. The testing apparatus can thus recognize a failed test condition by the absence of data on one or more of the DQ lines when the output enable signal OE# is indicative of a desire to enable data output. If data is present on each DQ line, the testing apparatus can then compare the output word with a word of the input data pattern on a bit-by-bit basis. If all bits match, the test is acceptable.

Conversely, if there is a mismatch between any bit of the output word and its corresponding bit of the input data pattern, the test is failed.

Figure 2:
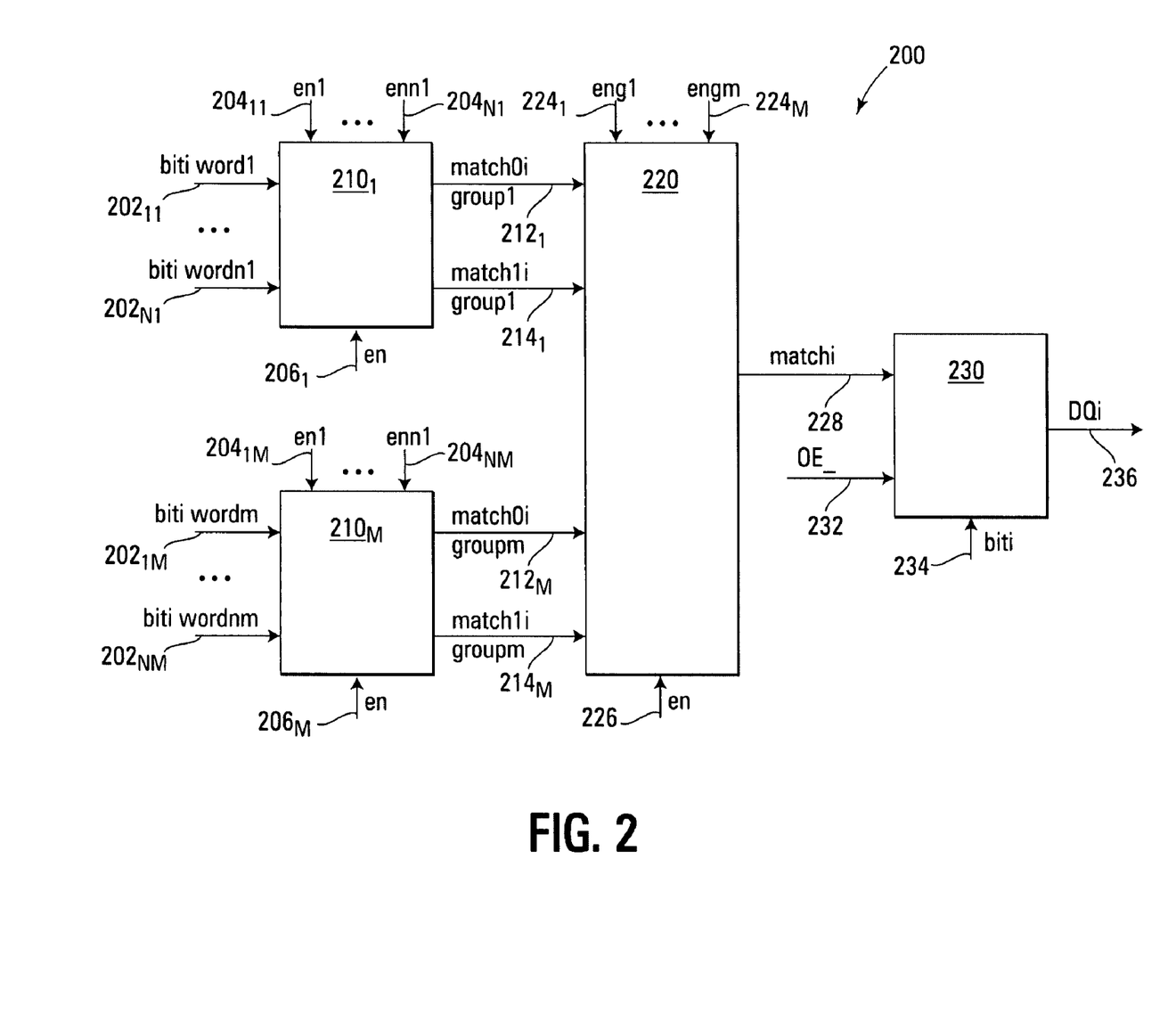
FIG. 2 is a block schematic of a data compression circuit in accordance with an embodiment of the invention.

FIG. 2 is a block schematic of a data compression circuit 200 in accordance with an embodiment of the invention. The data compression circuit 200 may be a part of the command control circuit 131. Data compression circuit 200 includes a first level data compression circuit 210 for each group of words, e.g., first level data compression circuits $210_1$ through $210_M$ for M groups of words. Each first level data compression circuit 210 receives the $i^{th}$ bit for each word in its respective group, i.e., bit inputs $202_{11}$-$202_{N1}$ for a first group of N words through $202_{1M}$-$202_{NM}$ for the $M^{th}$ group of N words. Each first level data compression circuit 210 may further receive one or more control signals. For example, each first level data compression circuit 210 may receive an enable signal controlling the comparison of an individual $i^{th}$ bit for each word in the group, e.g., enable signals $204_{11}$-$204_{N1}$ for the first group of N words through $204_{1M}$-$204_{NM}$ for the $M^{th}$ group of N words, and a global enable signal, enable signals $206_1$-$206_M$, for activating or disabling the test mode. Each first level data compression circuit 210 outputs two match signals 212 and 214. The first and second match signals 212 and 214 provide an indication as to whether there is a match of the $i^{th}$ bits of each word of their respective groups.

The data compression circuit 200 further includes a second level data compression circuit 220. The first match signals $212_1$-$212_M$ and the second match signals $214_1$-$214_M$ are provided to the second level data compression circuit 220. The second level data compression circuit 220 may further receive one or more control signals. For example, the second level data compression circuit 220 may receive an enable signal controlling the comparison of each set of match signals, e.g., enable signals $224_1$-$224_M$, and a global enable signal 226 for activating or disabling the test mode. Generally, the global enable signal 226 for the second level data compression circuit 220 and the global enable signals $206_1$-$206_M$ for the first level data compression circuits $210_1$-$210_M$, respectively, will track each other such that all of the data compression circuits are either operating in a normal mode of operation or a test mode of operation.

The second level data compression circuit 220 outputs a third match signal 228. The third match signal 228 provides an indication as to whether the first and second match signals 212 and 214 for each group of words indicate a match of their $i^{th}$ bits when the test mode is enabled.

The third match signal 228 is provided to an output buffer 230. The output buffer 230 further receives an output enable signal 232 and a data signal 234 representative of the $i^{th}$ bit of the word being read. The output buffer 230 is responsive to the data signal 234 when the output enable signal 232 indicates a desire to output data as long as the third match signal 228 does not indicate a mismatch, providing a data output signal 236 representative of the value of the data signal 234. If the third match signal 228 does indicate a mismatch, the output buffer circuit may be tri-stated to present a high impedance on the output 236.

Figure 3A:
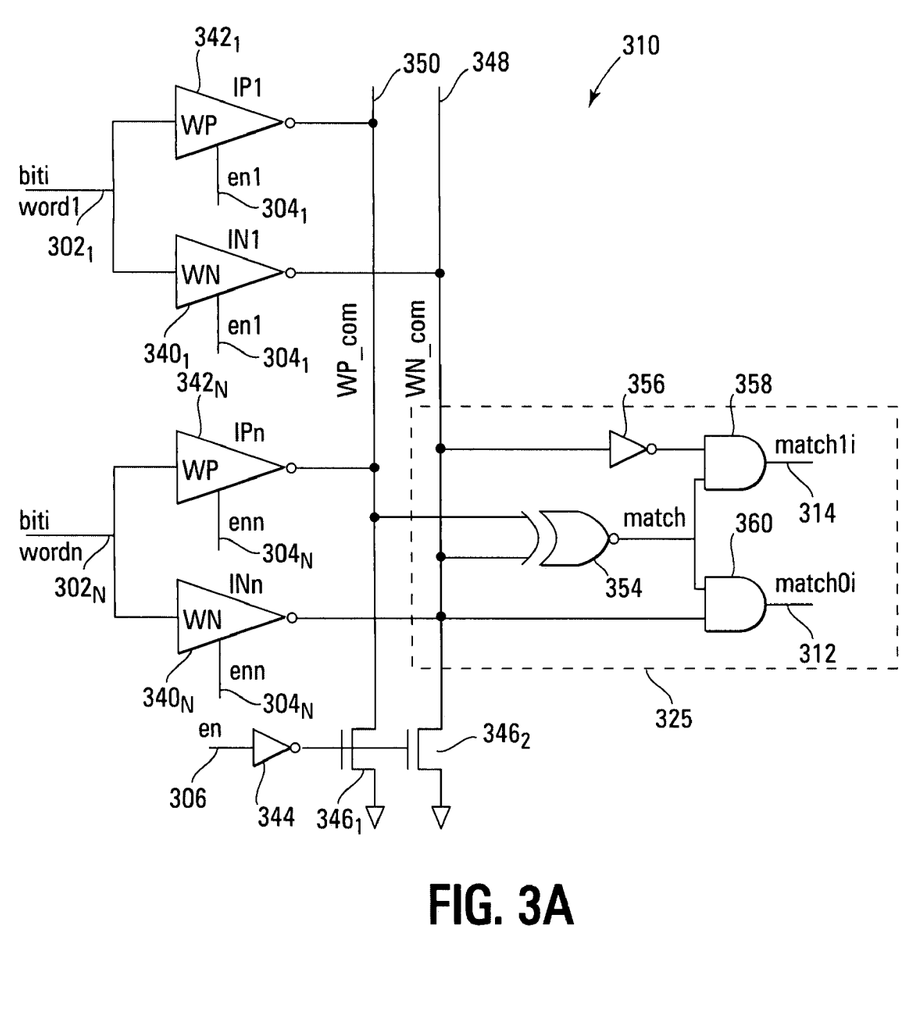
FIG. 3A is a schematic a first level data compression circuit in accordance with an embodiment of the invention.

FIG. 3A is a schematic providing more detail of a first level data compression circuit 310 in accordance with an embodiment of the invention. The first level data compression circuit 310 includes a first buffer stage 340 and a second buffer stage 342 for each of the N words. The first buffer stages 340 have their outputs commonly coupled to line 348 as a first input of the logic circuit 325. The second buffer stages 342 have their outputs commonly coupled to line 350 as a second input of the logic circuit 325. The logic circuit 325 may be selectively disabled, such as by pulling lines 348 and 350 to ground. As depicted in the embodiment of FIG. 3A, this may be accomplished in response to a control signal 306, buffered through inverter 344, selectively activating FETs $346_1$ and $346_2$. The logic circuit 325 generates the two match signals 312 and 314 corresponding to match0$i$ and match1$i$, respectively, for the first level data compression circuit 310. Additionally, each buffer stage 340 or 342 may be selectively enabled using a control signal 304, which may be the same signal as control signal 306.

For one embodiment, the logic circuit 325 includes a first AND gate 358 having a first input coupled to the line 348 through an inverter 356 and a second input coupled to an output of an XNOR gate 354. The logic circuit 325 further includes a second AND gate 360 having a first input coupled to the output of the XNOR gate 354 and a second input coupled to the line 348. The XNOR gate 354 has a first input coupled to the line 350 and a second input coupled to the line 348. Outputs of the AND gates 358 and 360 provide the control signals match1$i$ and match0$i$, respectively. If the data value of the $i^{th}$ bit location for each word in the group is 1, then match1$i$ has a first logic level, e.g., logic high, and match0$i$ has a second logic level, e.g., logic low. If the data value of the $i^{th}$ bit location for each word in the group is 0, then match1$i$ has the second logic level and match0$i$ has the first logic level. If the $i^{th}$ bit location for any word in the group is different from its corresponding location in another word of the group, then match1$i$ and match0$i$ each have the same logic level, e.g., logic low.

Each first buffer stage 340 produces an output signal driving a first current level when a logic low level is presented at its input and an output signal capable of sinking a second, lesser, current level when a logic high level is presented at its input. The first current level of each first buffer stage 340 is chosen such that it is greater than the sum of the second current levels for each remaining first buffer stage 340. As an example, for a page containing eight words, the first current level of a first buffer stage 340 is greater than seven times the second current level. In this manner, the combined output of the first buffer stages 340 is a logic high level if at least one data signal on inputs 315 has a logic low level; the current drive of one first buffer stage 340 cannot be overcome by the combined current sink of all remaining first buffer stages 340. Likewise, the combined output of the first buffer stages 340 is a logic low level only if all data signals on inputs 315 have a logic high level. For one embodiment, the first current level of the first buffer stages 340 is chosen to be much greater than the second current level of the first buffer stages 340 to reduce the response time of their combined output. For a further embodiment, the first current level is chosen relative to the second current level such that a response time for a transition of the combined signal of the first buffer stages 340 from a logic low level to a logic high level is less than approximately 10 nS.

Each second buffer stage 342 produces an output signal driving a first current level when a logic low level is presented at its input and an output signal capable of sinking a second, greater, current level when a logic high level is presented at its input. The second current level of each second buffer stage 342 is chosen such that it is greater than the sum of the first current levels for each remaining second buffer stage 342. As an example, for a page containing eight words, the second current level of a second buffer stage 342 is greater than seven times the first current level. In this manner, the combined output of the second buffer stages 342 is a logic low level if at least one data signal on inputs 315 has a logic high level; the current sink of one second buffer stage 342 cannot be overcome by the combined current drive of all remaining second buffer stages 342. Likewise, the combined output of the second buffer stages 342 is a logic high level only if all data signals on inputs 315 have a logic low level. For one embodiment, the second current level of the second buffer stages 342 is chosen to be much greater than the first current level of the second buffer stages 342 to reduce the response time of their combined output. For a further embodiment, the second current level is chosen relative to the first current level such that a response time for a transition of the combined signal of the second buffer stages 342 from a logic high level to a logic low level is less than approximately 10 nS.

Figure 3B:
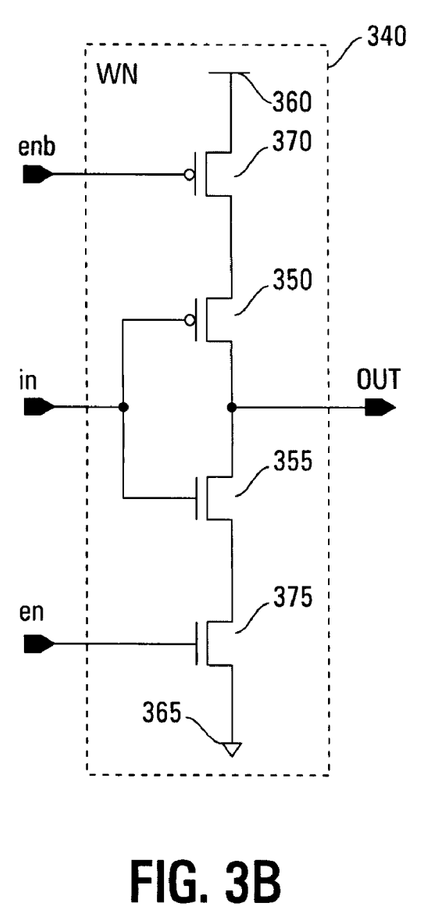
FIG. 3B is a schematic of a first buffer stage for use in the data compression circuit of FIG. 3A in accordance with an embodiment of the invention.
Figure 3C:
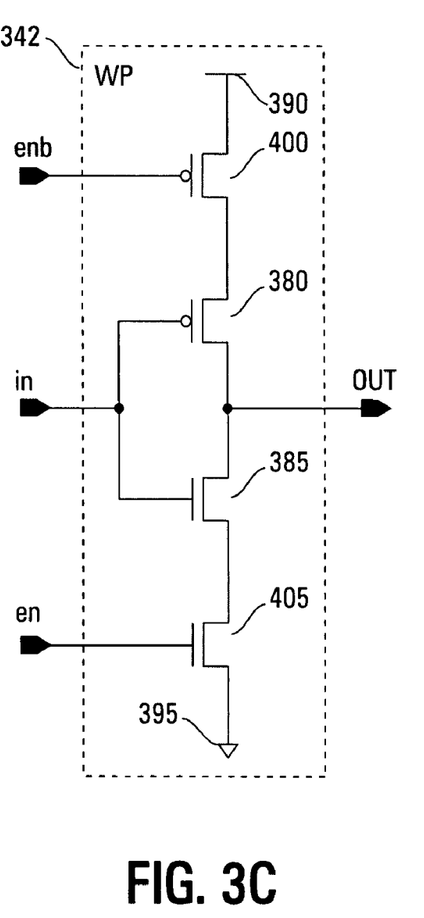
FIG. 3C is a schematic of a second buffer stage for use in the data compression circuit of FIG. 3A in accordance with an embodiment of the invention.

FIGS. 3B and 3C show schematics of a first buffer stage 340 and a second buffer stage 342, respectively, for use in the data compression circuit 200 of FIG. 3A in accordance with one embodiment of the invention. The first buffer stage 340 includes a first p-channel field-effect transistor (pFET) 350 and a first n-channel field-effect transistor (nFET) 355 coupled in series between a first potential node 360 and a second potential node 365. The first potential node 360 is coupled to receive a first potential and the second potential node 365 is coupled to receive a second potential lower than the first potential. The first potential node 360 may be coupled to receive a supply potential such as Vcc. The second potential node 365 may be coupled to receive a ground potential such as Vss.

The first pFET 350 and the first nFET 355 each have their drains coupled to the output of the first buffer stage 340 and their gates coupled to the input of the first buffer stage 340 for receiving the data signal. The first nFET 355 is a weak n-channel device such that its conductance at activation is low relative to the conductance at activation of the first pFET 350. The result is that the first nFET 355 is capable of sinking a relatively small current at activation while the first pFET 350 is capable of conducting a relatively large current at activation. For one embodiment, the first nFET 355 has a W/L ratio that is smaller than a W/L ratio of the first pFET 350. For a further embodiment, the first nFET 355 has a W/L ratio of approximately 3/10 while the first pFET 350 has a W/L ratio of approximately 40/1.

The data compression circuits 200 should be disabled in normal operation and enabled only during the desired testing. One method of disabling the data compression circuits 200 can include disabling each first buffer stage 340. As shown in FIG. 3B, the first buffer stage 340 further includes a second pFET 370 and a second nFET 375. The second pFET 370 is coupled between the first potential node 360 and the first pFET 350 and has its gate coupled to receive a first enable signal enb. The second nFET 375 is coupled between the second potential node 365 and the first nFET 355 and has its gate coupled to receive a second enable signal en. The second enable signal en may be the binary complement of the first enable signal enb such that the second pFET 370 and the second nFET 375 are either both activated or both deactivated. The enable signal en may correspond to the control signal 304 in FIG. 3A. The second pFET 370 and the second nFET 375 should be activated during the data compression test mode and deactivated during normal operation of the memory device. Deactivation of the second pFET 370 and the second nFET 375 disables the first buffer stage 340, thereby presenting a high impedance level at its output. For one embodiment, the second pFET 370 has the same width as the first pFET 350 and the second nFET 375 has the same width as the first nFET 355. Choosing the same width of these adjacent transistors simplifies fabrication of the transistors on a semiconductor substrate. For a further embodiment, the second pFET 370 has a W/L ratio of approximately 40/1 while the second nFET 375 has a W/L ratio of approximately 3/1.

As shown in FIG. 3C, the second buffer stage 342 includes a first pFET 380 and a first nFET 385 coupled in series between a first potential node 390 and a second potential node 395. The first potential node 390 is coupled to receive a first potential and the second potential node 395 is coupled to receive a second potential lower than the first potential. The first potential node 390 may be coupled to receive a supply potential such as Vcc. The second potential node 395 may be coupled to receive a ground potential such as Vss. For one embodiment, the first potential node 390 of the second buffer circuit 342 and the first potential node 360 of the first buffer circuit 340 are each coupled to receive the same supply potential. For a further embodiment, the second potential node 395 of the second buffer circuit 342 and the second potential node 365 of the first buffer circuit 340 are each coupled to receive the same ground potential.

The first pFET 380 and the first nFET 385 each have their drains coupled to the output of the second buffer stage 342 and their gates coupled to the input of the second buffer stage 342 for receiving the data signal. The first pFET 380 is a weak p-channel device such that its conductance at activation is low relative to the conductance at activation of the first nFET 385. The result is that the first pFET 380 is capable of conducting a relatively small current at activation while the first nFET 385 is capable of sinking a relatively large current at activation. For one embodiment, the first pFET 380 has a W/L ratio that is smaller than a W/L ratio of the first nFET 385. For a further embodiment, the first pFET 380 has a W/L ratio of approximately 4/5 while the first nFET 385 has a W/L ratio of approximately 20/1.

As noted before, the data compression circuits 200 should be disabled in normal operation and enabled only during the desired testing. A method of disabling the data compression circuits 200 can further include disabling each second buffer stage 342. As shown in FIG. 3C, the second buffer stage 342 further includes a second pFET 400 and a second nFET 405. The second pFET 400 is coupled between the first potential node 390 and the first pFET 380 and has its gate coupled to receive the first enable signal enb. The second nFET 405 is coupled between the second potential node 395 and the first nFET 385 and has its gate coupled to receive the second enable signal en. The second enable signal en may be the binary complement of the first enable signal enb such that the second pFET 400 and the second nFET 405 are either both activated or both deactivated. The second pFET 400 and the second nFET 405 should be activated during the data compression test mode and deactivated during normal operation of the memory device. Deactivation of the second pFET 400 and the second nFET 405 disables the second buffer stage 342, thereby presenting a high impedance level at its output. For one embodiment, the second pFET 400 has the same width as the first pFET 380 and the second nFET 405 has the same width as the first nFET 385. Choosing the same width of these adjacent transistors simplifies fabrication of the transistors on a semiconductor substrate. For a further embodiment, the second pFET 400 has a W/L ratio of 4/1 while the second nFET 405 has a W/L ratio of 20/1.

Figure 4:
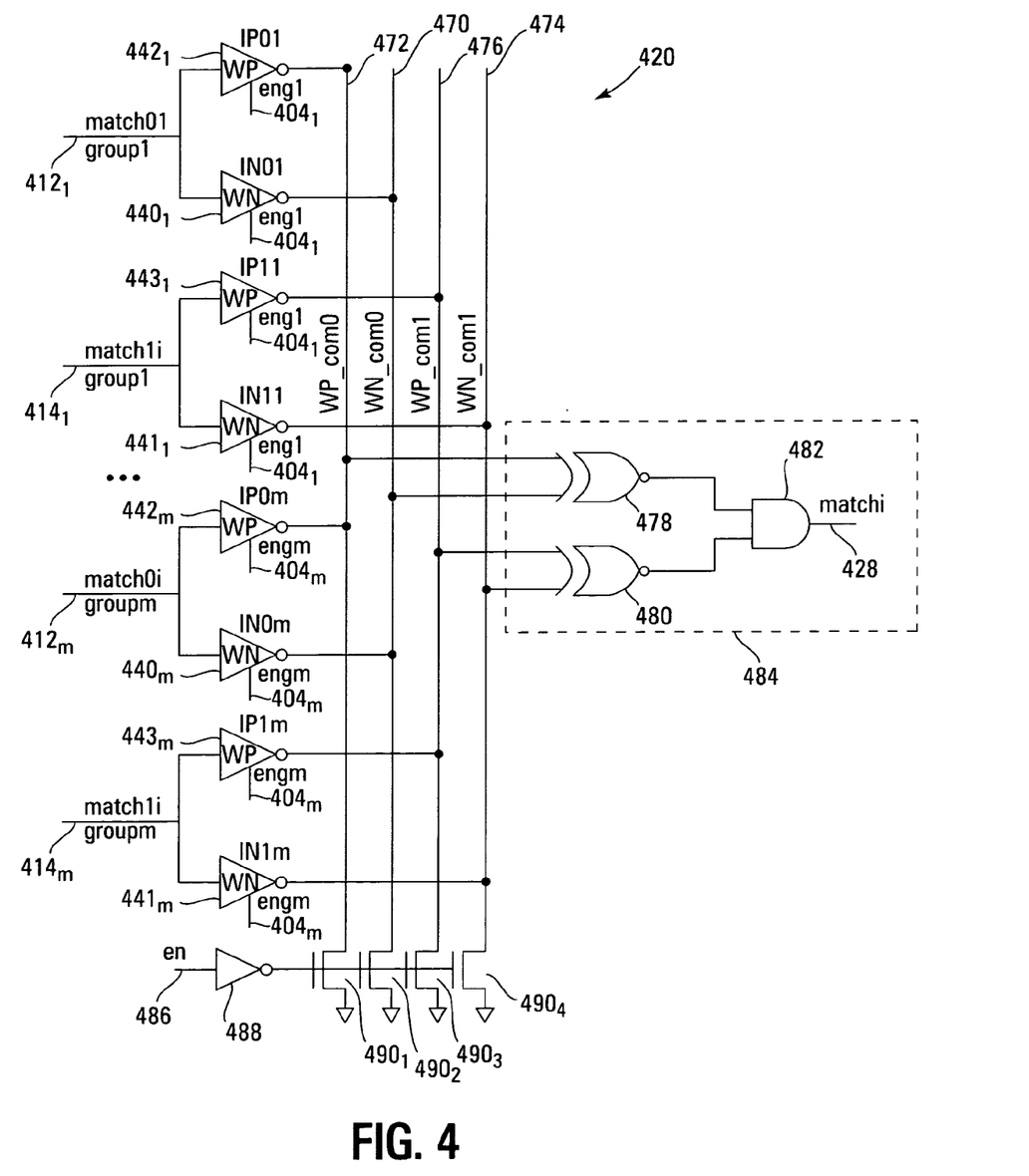
FIG. 4 is a schematic of a second level data compression circuit in accordance with an embodiment of the invention

FIG. 4 is a schematic providing more detail of a second level data compression circuit 420 in accordance with an embodiment of the invention. The second level data compression circuit 420 includes a first buffer stage 440 and a second buffer stage 442 corresponding to each match0$i$ signal 412 for each of the M groups of words. The first buffer stages 440 have their outputs commonly coupled to line 470 as a first input of the logic circuit 484. The second buffer stages 442 have their outputs commonly coupled to line 472 as a second input of the logic circuit 484. The second level data compression circuit 420 further includes a first buffer stage 441 and a second buffer stage 443 corresponding to each match1$i$ signal 414 for each of the M groups of words. The first buffer stages 441 have their outputs commonly coupled to line 474 as a third input of the logic circuit 484. The second buffer stages 443 have their outputs commonly coupled to line 476 as a fourth input of the logic circuit 484. The logic circuit 484 may be selectively disabled, such as by pulling lines 470, 472, 474 and 476 to ground. As depicted in the embodiment of FIG. 4, this may be accomplished in response to a control signal 486, buffered through inverter 488, selectively activating FETs $490_1$, $490_2$, $490_3$ and $490_4$. The logic circuit 484 generates the third match signal 428 corresponding to match$i$ for the second level data compression circuit 420. Additionally, each buffer stage 440, 441, 442 and 443 may be selectively enabled using a control signal 404, which may be the same signal as control signal 486. The logic circuit 484 has a first XNOR gate 478 for receiving the first and second inputs of the logic circuit 484 and a second XNOR gate 480 for receiving the third and fourth inputs of the logic circuit 484. The third match signal 428 is generated at the output of AND gate 482, receiving a first input from the first XNOR gate 478 and a second input from the second XNOR gate 480.

Guidance and operation for the first buffer stages 440 and 441 follows the guidance and operation given with respect to the first buffer stages 340. Similarly, guidance and operation for the second buffer stages 442 and 443 follows the guidance and operation given with respect to the second buffer stages 342. For buffer stages 440, 441, 442 and 443, the control signal 404 may correspond to the enable signal en in FIGS. 3B and 3C. In this manner, if all the match0$i$ and match1$i$ signals indicate that all the bit locations for each of the words of a group matched, whether a data value of 0 or 1, and the match0$i$ and match1$i$ signals for each group of words are the same, then the match$i$ signal is generated to have a first logic level, e.g., logic high. Likewise, if any of the match0$i$ and match1$i$ signals indicate that less than all of the bit locations matched for each word of a group, or that less than all of the groups have the same data value, the match$i$ signal is genera6ted to have a second logic level, e.g., logic low.

The data compression test mode may be entered or initiated in response to a sequence or pattern of one or more control signals received by the memory device. In the data compression test mode, the data compression circuits are activated or enabled. For example, the enable signals en and enb may be transitioned to appropriate logic levels to activate the first and second buffer circuits and their compression circuits. A data pattern is written to the memory array either before or after enabling the data compression circuits. The memory array is then accessed to generate a page of output containing two or more words, each word containing one or more bits.

The data signal for each bit of a word in the page of output is compared to its corresponding bit for every other word in a group of words. The results of each group of words are then compared. If the bits for each bit location in a word match for every word in its group, and each group of words is indicative of a match for each of its words, the output drivers are not inhibited, i.e., the output drivers are allowed to be responsive to the output enable signal and their data signals. If a bit location in a word has a data signal value that is different from the corresponding bit location in any other word of its group, for any group, the output driver for that bit location is disabled regardless of the value of the output enable signal or the data signal. For another embodiment, if any bit location in a word has a data signal value that is different from the corresponding bit location in any other word of its group, for any group, the output drivers for all bit locations are disabled regardless of the value of the output enable signal or the data signals. The output enable signal is transitioned to a logic level indicative of a desire to output data; enabled output drivers will present a data signal on their outputs and disabled output drivers will present a high impedance on their outputs.

The conditions of the output drivers may be detected by the testing apparatus as differing potential levels, e.g., a data signal having a first logic level for an enabled output driver may be represented by a first potential level, a data signal having a second logic level for an enabled output driver may be represented by a second potential level and a data signal having any logic level for a disabled output driver may be represented by an intermediate potential level between the first potential level and the second potential level or a high impedance. The first potential level may be a supply potential such as Vcc, the second potential level may be a ground potential such as Vss, and the intermediate potential level may be approximately Vcc/2. In response to one or more disabled output drivers, when output is expected, the testing apparatus can deem the device under test (DUT) to be failed. Output is expected when the output enable signal, such as the control signal OE#, is provided to the DUT and has a logic level indicative of a desire to provide output.

Note that a bit location may contain the wrong data value in each word of the page. While this will not cause an output driver to be disabled, as each word will contain the same data value for the bit location, it will result in the wrong data value provided on the DQ line. Accordingly, the testing apparatus must still compare the data value read from the memory array to the data pattern value written to the memory array to determine failure of the DUT if data signals are provided on each DQ line.

If the DUT passes for one word, e.g., the first word, read from the page, it is deemed to pass for each word of the group containing the first word, and each group of words associated with the group containing the first word. With each level of compression containing multiple words/groups, a write verify test performed in accordance with the invention can dramatically improve time required for such testing. With device failure or acceptance determinable upon reading only one word representative of the status of many, e.g., 100 or more, words, the time that would have been required to read such additional words is eliminated.

CONCLUSION

Memory devices have been described having a normal mode of operation and a test mode of operation. The test mode of operation includes a data compression test mode containing two or more levels of compression. In the data compression test mode, reading one word provides an indication of the data values of multiple words of the memory device. A first compression level provides an indication if a bit location of one word has the same data value as each corresponding bit location of a group of words. A second compression level provides an indication if each group of words indicated that each bit location of each of its words had the same data value. The time necessary to read and verify a repeating test pattern can be reduced as only a small fraction of the words need be read to determine the ability of the memory device to accurately write and store data values. The memory devices include data compression circuits to compare data values for each bit location of each word of a group of words, and to compare results for each of the groups of words. Output is selectively disabled if a bit location for one word has a data value differing from any remaining word of its group, for at least one group. Testing apparatus can detect the disabled output and deem a device failed if output is disabled when output is expected. By comparing the bit locations internal to the memory device, the testing apparatus need only read a fraction of the words to determine whether all words match the repeating test pattern. Test time can thus be reduced to a fraction of the time required to read each word of the array.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, additional compression levels could be added to further reduce testing time. Accordingly, this application is intended to cover any adaptations or variations of the invention. It is manifestly intended that this invention be limited only by the following claims and equivalents thereof.

What is claimed is:

1. A data compression circuit in a memory device, comprising:
   a plurality of first level data compression circuits for receiving data signals corresponding to bit locations of each word of a group of words of the memory device and for providing a first match signal and a second match signal, the first match signal having a first logic level and the second match signal having a second logic level if a corresponding bit location for each word of the group has a first data value, the first match signal having the second logic level and the second match signal having the first logic level if the corresponding bit location for each word of the group has a second data value, and the first and second match signals otherwise having the same logic level; and
   a second level data compression for receiving the first and second match signals from each of the first level data compression circuits and for providing a third match signal having a first logic level if all of the first match signals have the same logic level and all of the second match signals have the same logic level, and otherwise having a second logic level.

2. The data compression circuit of claim 1, wherein each first level data compression circuit comprises:
   a first logic circuit for receiving the data signals corresponding to a given bit location of each word of a group of words of the memory device and for providing a first output signal indicative of whether each data signal has the first data value; and
   a second logic circuit for receiving the data signals corresponding to the given bit location of each word of the group of words of the memory device and for providing a second output signal indicative of whether each data signal has the second data value.

3. The data compression circuit of claim 2, wherein the first logic circuit further comprises:
   a plurality of inputs, wherein the inputs are coupled to receive data signals corresponding to the given bit location of each word of the group of words of the memory device; and
   an output, wherein the output of the first logic circuit has a first logic level when each input receives a data signal having a logic low level and a second logic level when any input receives a data signal having a logic high level.

4. The data compression circuit of claim 3, wherein the first logic level of the first logic circuit is a logic high level and the second logic level of the first logic circuit is a logic low level.

5. The data compression circuit of claim 2, wherein the second logic circuit further comprises:
   a plurality of inputs, wherein the inputs are coupled to receive data signals corresponding to the given bit location of each word of a group of words of the memory device; and
   an output, wherein the output of the second logic circuit has a first logic level when each input receives a data signal having the logic high level and a second logic level when any input receives a data signal having the logic low level.

6. The data compression circuit of claim 5, wherein the first logic level of the second logic circuit is a logic low level and the second logic level of the second logic circuit is a logic high level.

7. A data compression circuit in a memory device, comprising:
   for each word of a group of words of the memory device:
      a first logic circuit for receiving data signals corresponding to a given bit location of each word of a group of words and for providing a first output signal indicative of whether each data signal has a first data value;
      a second logic circuit for receiving the data signals corresponding to the given bit location of each word of that group of words of the memory device and for providing a second output signal indicative of whether each data signal has a second data value;
   for each group of words of a plurality of words of the memory device:
      a third logic circuit for receiving each of the first and second match signals corresponding to a group of words and for providing a first match signal and a second match signal, the first match signal having a first logic level and the second match signal having a second logic level when the first output signal indicates that each data signal has its first data value, the first match signal having the second logic level and the second match signal having the first logic level when the second output signal indicates that each data signal has its second data value, and the first and second match signals having the same logic level when the first match signal does not indicate that each data signal has its first data value and the second match signal does not indicate that each data signal has its second data value;
   a fourth logic circuit for receiving the first match signals for each of the groups of words and for providing a third output signal indicative of whether each first match signal has its second logic level;
   a fifth logic circuit for receiving the first match signals for each of the groups of words and for providing a fourth output signal indicative of whether each first match signal has its first logic level;
   a sixth logic circuit for receiving the second match signals for each of the groups of words and for providing a fifth output signal indicative of whether each second match signal has its second logic level;
   a seventh logic circuit for receiving the second match signals for each of the groups of words and for providing a sixth output signal indicative of whether each second match signal has its first logic level;
   an eighth logic circuit for receiving each of the third, fourth, fifth and sixth output signals and for providing a third match signal having a first logic level if each of the third and fourth output signals have the same logic level and each of the fifth and sixth output signals have the same logic level.

8. The data compression circuit of claim 7, wherein the third logic circuit further comprises:
an inverter having an input coupled to receive the second output signal and having an output;
an XNOR gate having a first input coupled to receive the first output signal, a second input coupled to receive the second output signal, and an output;
a first AND gate having a first input coupled to receive the output of the inverter, a second input coupled to receive the output of the XNOR gate, and an output for providing the second match signal; and
a second AND gate having a first input coupled to receive the second output signal, a second input coupled to receive the output of the XNOR gate, and an output for providing the first match signal.

9. The data compression circuit of claim 7, wherein the first logic circuit further comprises:
a plurality of first buffer stages, each first buffer stage having an input coupled to receive a data signal for the given bit location of a word of the group of words of the memory device and having an output, wherein the outputs of the first buffer stages are commonly coupled to provide the first output signal and wherein each first buffer stage further comprises:
a first p-channel field-effect transistor having a gate coupled to the input of its first buffer stage, a source coupled to a first potential node, and a drain coupled to the output of its first buffer stage; and
a first n-channel field-effect transistor having a gate coupled to the input of its first buffer stage, a source coupled to a second potential node, and a drain coupled to the output of its first buffer stage;
wherein the first potential node is coupled to receive a first potential and the second potential node is coupled to receive a second potential lower than the first potential; and
wherein the first p-channel field-effect transistor is sized to have a conductance at activation that is lower than a conductance at activation for the first n-channel field-effect transistor.

10. The data compression circuit of claim 9, wherein the second logic circuit further comprises:
a plurality of second buffer stages, each second buffer stage having an input coupled to receive a data signal for the given bit location of a word of the group of words of the memory device and having an output, wherein the outputs of the second buffer stages are commonly coupled to provide the second output signal and wherein each second buffer stage further comprises:
a first p-channel field-effect transistor having a gate coupled to the input of its second buffer stage, a source coupled to a first potential node, and a drain coupled to the output of its second buffer stage; and
a first n-channel field-effect transistor having a gate coupled to the input of its second buffer stage, a source coupled to a second potential node, and a drain coupled to the output of its second buffer stage;
wherein the first potential node is coupled to receive a first potential and the second potential node is coupled to receive a second potential lower than the first potential; and
wherein the first p-channel field-effect transistor is sized to have a conductance at activation that is higher than a conductance at activation for the first n-channel field-effect transistor.

11. The data compression circuit of claim 10, wherein the first p-channel field-effect transistor of a first buffer stage has a larger W/L ratio than the first n-channel field-effect transistor of the first buffer stage.

12. The data compression circuit of claim 11, wherein the first p-channel field-effect transistor of the first buffer stage has a W/L ratio of approximately 40/1 and the first n-channel field-effect transistor of the first buffer stage has a W/L ratio of approximately 3/10.

13. The data compression circuit of claim 10, wherein each second buffer stage is coupled to receive a data signal corresponding to a different word of the group of words and wherein there is one second buffer stage for each word of the group of words.

14. The data compression circuit of claim 10, wherein the first potential node of a second buffer stage is coupled to receive a supply potential.

15. The data compression circuit of claim 10, wherein the second potential node of a second buffer stage is coupled to receive a ground potential.

16. The data compression circuit of claim 10, wherein the first potential node of each first buffer stage and the first potential node of each second buffer stage are each coupled to receive the same supply potential.

17. The data compression circuit of claim 10, wherein the second potential node of each first buffer stage and the second potential node of each second buffer stage are each coupled to receive the same ground potential.

18. The data compression circuit of claim 10, further comprising:
wherein each first buffer stage further comprises a second p-channel field-effect transistor coupled between the first potential node and the first p-channel field-effect transistor and a second n-channel field-effect transistor coupled between the second potential node and the first n-channel field-effect transistor;
wherein the second p-channel field-effect transistor has a gate coupled to receive a first enable signal; and
wherein the second n-channel field-effect transistor has a gate coupled to receive a second enable signal different from the first enable signal.

19. The data compression circuit of claim 18, wherein the second enable signal is the binary complement of the first enable signal.

20. The data compression circuit of claim 10, further comprising:
wherein each second buffer stage further comprises a second p-channel field-effect transistor coupled between the first potential node and the first p-channel field-effect transistor and a second n-channel field-effect transistor coupled between the second potential node and the first n-channel field-effect transistor;
wherein the second p-channel field-effect transistor has a gate coupled to receive a first enable signal; and
wherein the second n-channel field-effect transistor has a gate coupled to receive a second enable signal different from the first enable signal.

21. The data compression circuit of claim 20, wherein the second enable signal is the binary complement of the first enable signal.

22. The data compression circuit of claim 10, wherein the fourth logic circuit further comprises:

a plurality of first buffer stages, each first buffer stage having an input coupled to receive the first match signal for a group of words and having an output, wherein the outputs of the first buffer stages are commonly coupled.

23. The data compression circuit of claim 22, wherein the fifth logic circuit further comprises:
a plurality of second buffer stages, each second buffer stage having an input coupled to receive the first match signal for a group of words and having an output, wherein the outputs of the second buffer stages are commonly coupled.

24. The data compression circuit of claim 23, wherein the sixth logic circuit further comprises:
a plurality of first buffer stages, each first buffer stage having an input coupled to receive the second match signal for a group of words and having an output, wherein the outputs of the first buffer stages are commonly coupled.

25. The data compression circuit of claim 24, wherein the fifth logic circuit further comprises:
a plurality of second buffer stages, each second buffer stage having an input coupled to receive the second match signal for a group of words and having an output, wherein the outputs of the second buffer stages are commonly coupled.

26. The data compression circuit of claim 9, wherein the first p-channel field-effect transistor of a second buffer stage has a smaller W/L ratio than the first n-channel field-effect transistor of the second buffer stage.

27. The data compression circuit of claim 26, wherein the first p-channel field-effect transistor of the second buffer stage has a W/L ratio of approximately 4/5 and the first n-channel field-effect transistor of the second buffer stage has a W/L ratio of approximately 20/1.

28. The data compression circuit of claim 9, wherein each first buffer stage is coupled to receive a data signal corresponding to a different word of the group of words and wherein there is one first buffer stage for each word of the group of words.

29. The data compression circuit of claim 9, wherein the first potential node of a first buffer stage is coupled to receive a supply potential.

30. The data compression circuit of claim 9, wherein the second potential node of a first buffer stage is coupled to receive a ground potential.

31. A memory device, comprising:
a plurality of first level data compression circuits for receiving data signals corresponding to bit locations of each word of a group of words of the memory device and for providing a first match signal and a second match signal, the first match signal having a first logic level and the second match signal having a second logic level if a corresponding bit location for each word of the group has a first data value, the first match signal having the second logic level and the second match signal having the first logic level if the corresponding bit location for each word of the group has a second data value, and the first and second match signals otherwise having the same logic level;
a second level data compression for receiving the first and second match signals from each of the first level data compression circuits and for providing a third match signal having a first logic level if all of the first match signals have the same logic level and all of the second match signals have the same logic level, and otherwise having a second logic level; and
an output driver circuit for providing an output signal indicative of a data signal, wherein the output driver circuit is disabled when the third match signal has its first logic level.

32. The memory device of claim 31, wherein the output driver circuit is responsive to a second control signal and its data signal when the third match signal has the first logic level.

33. The memory device of claim 32, wherein the second control signal is a global output enable signal.

34. The memory device of claim 32, wherein the third match signal and the second control signal are combined as part of a global inhibit signal and the output driver circuit is responsive to the global inhibit signal.

35. A method of testing a memory device, comprising:
accessing a memory array of the memory device to generate data signals for two or more groups of words, each group of words comprising two or more words, each word comprising two or more bit locations;
comparing data signals for a given bit location of each word of a group of words for the two or more groups of words;
generating a first match signal and a second match signal for each group of words in response to the comparison of the data signals, each set of first and second match signals having a first logic level when each of the data signals for a given bit location has a first data value for each word of that group of words, each set of first and second match signals having a second logic level when each of the data signals for a given bit location has a second data value for each word of that group of words, and otherwise each set of first and second match signals having differing logic levels for that group of words;
comparing each of the first match signals and comparing each of the second match signals;
generating a third match signal in response to the comparison of the first match signals and the comparison of the second match signals, wherein the third match signal has a first logic level only when each of the first match signals has the same logic level and each of the second match signals has the same logic level;
disabling output for data signals corresponding to at least the given bit location if the third match signal has a second logic level;
attempting to read a word of the memory device; and
determining whether output is disabled for at least the given bit location, wherein disabled output is indicative of failure of the memory device.

36. The method of claim 35, wherein attempting to read a word of the memory device comprises attempting to read only one word of the memory device.

37. The method of claim 35, further comprising:
writing the repeating data pattern to the memory array prior to accessing the memory array.

38. The method of claim 37, wherein the repeating data pattern is a repeating pattern of all zeros.

39. The method of claim 37, wherein the repeating data pattern is a repeating pattern of all ones.

40. The method of claim 37, wherein the repeating data pattern is a checkerboard pattern.

41. The method of claim 37, wherein the repeating data pattern is a reverse checkerboard pattern.

42. The method of claim 35, further comprising:
repeating the method for additional groups of words of the memory device.

* * * * *